US012568668B2

(12) United States Patent
Shimizu

(10) Patent No.: US 12,568,668 B2
(45) Date of Patent: Mar. 3, 2026

(54) NITRIDE SEMICONDUCTOR DEVICE AND METHOD FOR MANUFACTURING NITRIDE SEMICONDUCTOR DEVICE

(71) Applicant: KABUSHIKI KAISHA TOSHIBA, Tokyo (JP)

(72) Inventor: Tatsuo Shimizu, Tokyo (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 453 days.

(21) Appl. No.: 18/181,042

(22) Filed: Mar. 9, 2023

(65) Prior Publication Data

US 2024/0097000 A1 Mar. 21, 2024

(30) Foreign Application Priority Data

Sep. 15, 2022 (JP) ................................. 2022-147349

(51) Int. Cl.
| | |
|---|---|
| *H10D 62/85* | (2025.01) |
| *H01L 21/265* | (2006.01) |
| *H01L 21/285* | (2006.01) |
| *H10D 30/47* | (2025.01) |
| *H10D 64/62* | (2025.01) |

(52) U.S. Cl.
CPC ....... *H10D 62/85* (2025.01); *H01L 21/26546* (2013.01); *H01L 21/28575* (2013.01); *H10D 30/475* (2025.01); *H10D 62/8503* (2025.01); *H10D 64/62* (2025.01)

(58) Field of Classification Search
CPC .. H10D 62/85; H10D 30/475; H10D 62/8503; H10D 64/62; H10D 30/4755; H10D 62/149; H10D 62/854; H10D 64/01; H01L 21/26546; H01L 21/28575
See application file for complete search history.

(56) References Cited

U.S. PATENT DOCUMENTS

| | | | |
|---|---|---|---|
| 11,362,174 B2 | 6/2022 | Shimizu | |
| 2017/0047412 A1 | 2/2017 | Tanaka et al. | |
| 2017/0263725 A1* | 9/2017 | Tanaka .................. | H10D 30/477 |
| 2021/0082911 A1* | 3/2021 | Chiu ....................... | H10D 84/05 |
| 2021/0118984 A1* | 4/2021 | Shimizu ............... | H10D 62/824 |
| 2022/0285503 A1 | 9/2022 | Tanaka et al. | |

FOREIGN PATENT DOCUMENTS

| | | |
|---|---|---|
| JP | 2010-28052 A | 2/2010 |
| JP | 2010-80493 A | 4/2010 |
| JP | 2011-129715 A | 6/2011 |

(Continued)

*Primary Examiner* — Ratisha Mehta
*Assistant Examiner* — Sophia W Kao
(74) *Attorney, Agent, or Firm* — Finnegan, Henderson, Farabow, Garrett & Dunner, LLP

(57) ABSTRACT

A semiconductor device of an embodiment includes a first nitride region being nitride selected from aluminum gallium nitride and aluminum nitride, the first nitride region being an n-type semiconductor, and a second gallium nitride region in contact with the first nitride region, the second gallium nitride region being the nitride, the second gallium nitride region being metal, the second gallium nitride region containing a first element being at least one element selected from a group consisting of Be, Mg, Ca, Sr, Ba, Sc, Y, La, Ce, Pr, Nd, Pm, Sm, Eu, Gd, Tb, Dy, Ho, Er, Tm, Yb, Lu, V, Nb, Ta, Li, Na, K, Rb, Ce, and Zn.

16 Claims, 6 Drawing Sheets

(56)        References Cited

FOREIGN PATENT DOCUMENTS

| JP | 2014-154685 | A | | 8/2014 |
|----|-------------|---|---|--------|
| JP | 2017-163021 | A | | 9/2017 |
| JP | 2020-25056 | A | | 2/2020 |
| JP | 2020-43357 | A | | 3/2020 |
| JP | 2020043357 | A | * | 3/2020 |
| JP | 2021-68722 | A | | 4/2021 |
| JP | 2021197533 | A | * | 12/2021 |
| JP | 2022-92828 | A | | 6/2022 |

* cited by examiner

FIG.2

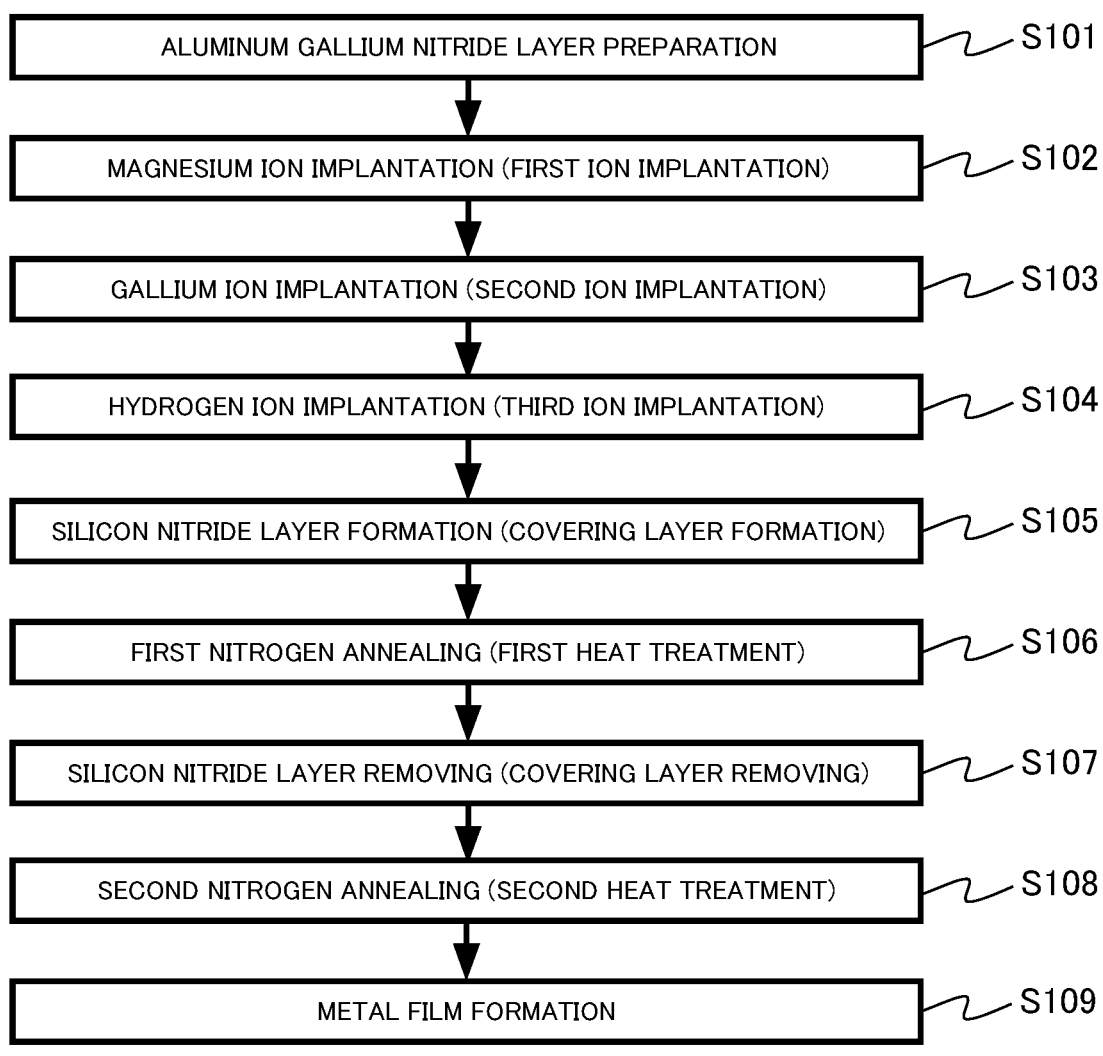

ALUMINUM GALLIUM NITRIDE LAYER PREPARATION    S101

MAGNESIUM ION IMPLANTATION (FIRST ION IMPLANTATION)    S102

GALLIUM ION IMPLANTATION (SECOND ION IMPLANTATION)    S103

HYDROGEN ION IMPLANTATION (THIRD ION IMPLANTATION)    S104

SILICON NITRIDE LAYER FORMATION (COVERING LAYER FORMATION)    S105

FIRST NITROGEN ANNEALING (FIRST HEAT TREATMENT)    S106

SILICON NITRIDE LAYER REMOVING (COVERING LAYER REMOVING)    S107

SECOND NITROGEN ANNEALING (SECOND HEAT TREATMENT)    S108

METAL FILM FORMATION    S109

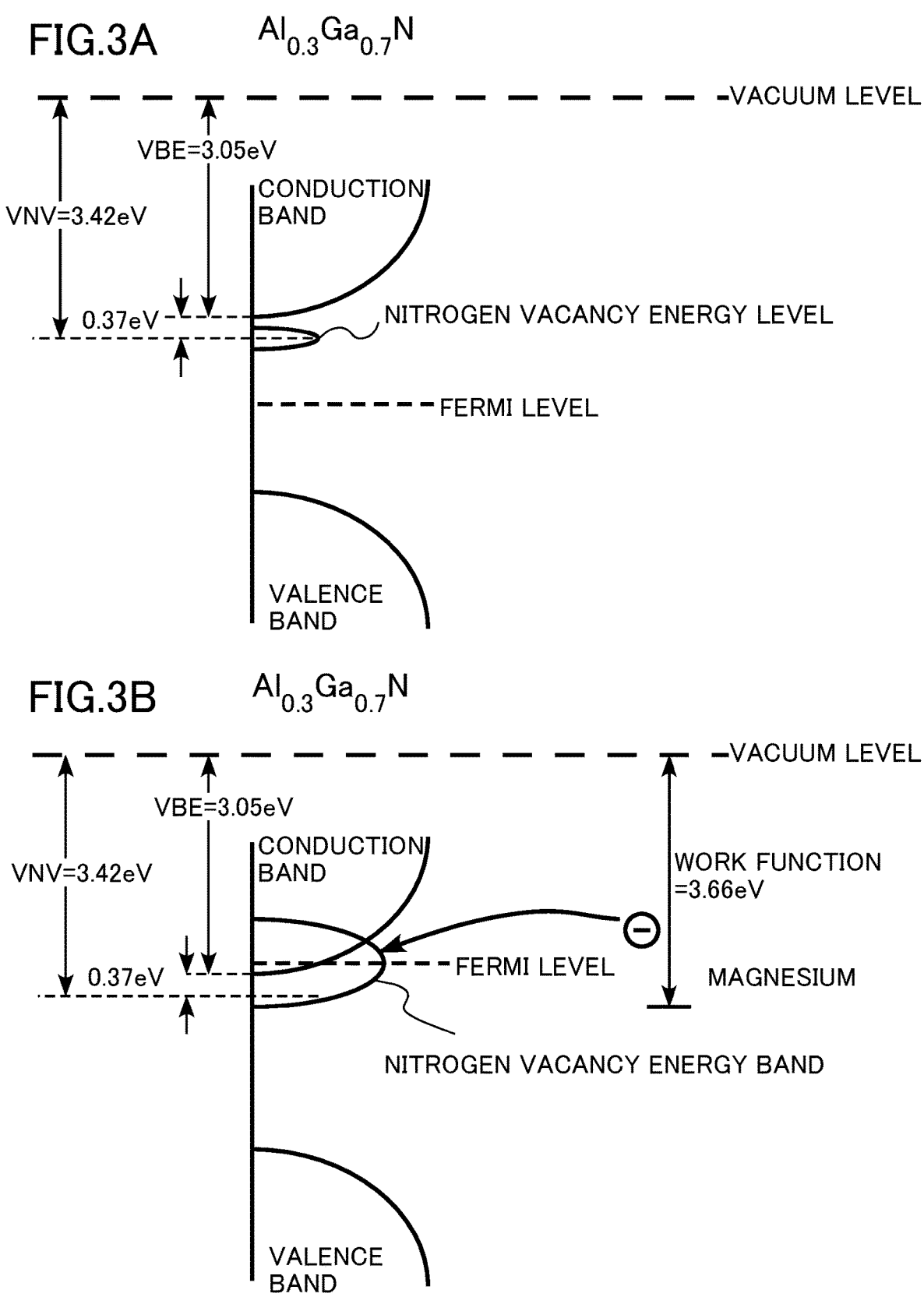
FIG.3A     $Al_{0.3}Ga_{0.7}N$
VACUUM LEVEL
VBE=3.05eV
VNV=3.42eV
CONDUCTION BAND
0.37eV
NITROGEN VACANCY ENERGY LEVEL
FERMI LEVEL
VALENCE BAND
FIG.3B     $Al_{0.3}Ga_{0.7}N$
VACUUM LEVEL
VBE=3.05eV
VNV=3.42eV
CONDUCTION BAND
WORK FUNCTION =3.66eV
0.37eV
FERMI LEVEL
MAGNESIUM
NITROGEN VACANCY ENERGY BAND
VALENCE BAND AlxGa1−xN

NITRIDE SEMICONDUCTOR DEVICE AND METHOD FOR MANUFACTURING NITRIDE SEMICONDUCTOR DEVICE

CROSS-REFERENCE TO RELATED APPLICATION

This application is based upon and claims the benefit of priority from Japanese Patent Application No. 2022-147349, filed on Sep. 15, 2022, the entire contents of which are incorporated herein by reference.

FIELD

Embodiments described herein relate generally to a semiconductor device and a method for manufacturing a semiconductor device.

BACKGROUND

Semiconductor elements, such as transistors and diodes, are used in circuits, such as switching power supply circuits and inverter circuits. These semiconductor elements are required to have high breakdown voltage and low on-resistance. The relation between breakdown voltage and on-resistance has a trade-off relation determined by the element material.

Advances in technological development have enabled semiconductor elements to achieve low on-resistance close to the limits of silicon, which is the major element material used for semiconductor elements. In order to further improve breakdown voltage or further reduce on-resistance, it is necessary to change an element material. By using a nitride semiconductor, such as gallium nitride or aluminum gallium nitride, as the element material for semiconductor elements, the trade-off relation determined by the element material can be improved. This enables dramatically higher breakdown voltages and lower on-resistance of semiconductor elements.

When nitride semiconductors are used to form semiconductor elements, it is desirable to achieve metal electrodes with low connection resistance to nitride semiconductors. Forming metal electrodes with low connection resistance to nitride semiconductors can achieve higher performance of semiconductor elements. The connection resistance may be called contact resistance.

BRIEF DESCRIPTION OF THE DRAWINGS

FIG. 2 is a diagram illustrating a manufacturing procedure of a method for manufacturing the semiconductor device of the first embodiment;

FIGS. 3A and 3B are diagrams for explaining functions and effects of the semiconductor device of the first embodiment;

DETAILED DESCRIPTION

Figure 1:
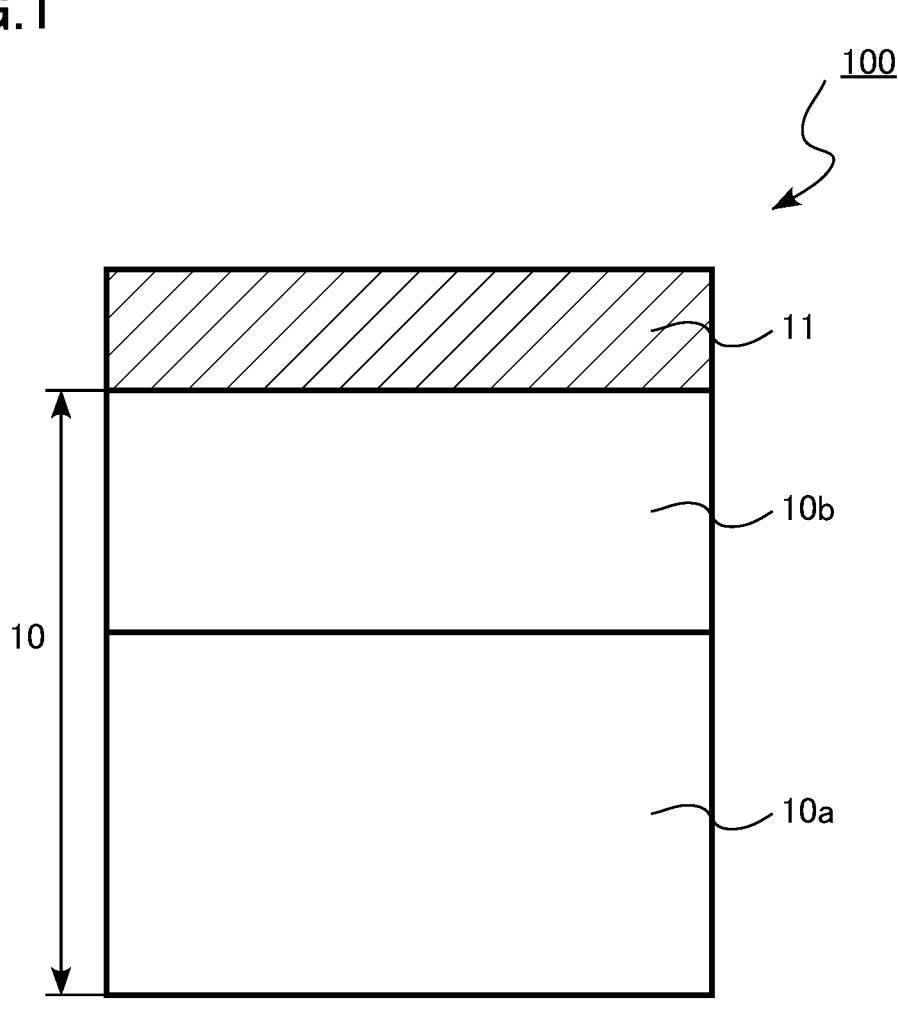
FIG. 1 is a schematic sectional view illustrating a semiconductor device of a first embodiment.

A semiconductor device of an embodiment includes a first nitride region being nitride selected from aluminum gallium nitride and aluminum nitride, the first nitride region being an n-type semiconductor, and a second nitride region in contact with the first nitride region, the second nitride region being the nitride, the second nitride region being metal, the second nitride region containing a first element being at least one selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn).

Hereinafter, embodiments of the present disclosure will be described with reference to the drawings. Note that, in the following description, the same reference signs are assigned to the same or similar members, and the description of the member that has been described will be omitted.

In this specification, the upper part of the drawing is described as "upper" and the lower part of the drawing as "lower" to indicate the positional relation of parts or the like. In the present specification, the terms "upper" and "lower" do not necessarily indicate the relation with the gravity direction.

In the following description, $n^+$, $n$, and $n^-$, or $p^+$, $p$, and $p^-$ represent relative levels of impurity concentration in each conductive type. That is, $n^+$ has a relatively higher n-type impurity concentration than $n$, and $n^-$ has a relatively lower n-type impurity concentration than $n$. Furthermore, $p^+$ has a relatively higher p-type impurity concentration than $p$, and $p^-$ has a relatively lower p-type impurity concentration than $p$. Note that, an $n^+$-type and an $n^-$-type will be also simply referred to as an n-type, and a $p^+$-type and a $p^-$-type will be also simply referred to as a p-type.

First Embodiment

A semiconductor device of a first embodiment includes a first nitride region being nitride selected from aluminum gallium nitride and aluminum nitride, the first nitride region being an n-type semiconductor, and a second nitride region in contact with the first nitride region, the second nitride region being the nitride, and the second nitride region being metal, the second nitride region containing a first element being at least one selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn).

FIG. 1 is a schematic sectional view illustrating the semiconductor device of the first embodiment. The semiconductor device of the first embodiment has a contact structure 100 that electrically connects a nitride semiconductor and a metal electrode.

The contact structure 100 of the first embodiment includes a nitride layer 10 and a metal electrode 11. The nitride layer 10 includes a first nitride region 10*a* and a second nitride region 10*b*.

The nitride layer 10 contains at least nitride selected from aluminum gallium nitride and aluminum nitride. The nitride layer 10 is, for example, single-crystal aluminum gallium nitride. Alternatively, the nitride layer 10 is, for example, single-crystal aluminum nitride.

The first nitride region 10a is an n-type semiconductor.

The first nitride region 10a is nitride selected from aluminum gallium nitride and aluminum nitride. The first nitride region 10a is, for example, aluminum gallium nitride of the n-type semiconductor. Alternatively, the first nitride region 10a is, for example, aluminum nitride of the n-type semiconductor.

The first nitride region 10a contains, for example, silicon (Si) as an n-type impurity. The n-type impurity concentration of the first nitride region 10a is, for example, $1 \times 10^{15}$ cm$^{-3}$ or more and $1 \times 10^{21}$ cm$^{-3}$ or less.

The second nitride region 10b is provided on the first nitride region 10a. The second nitride region 10b is in contact with the first nitride region 10a. The second nitride region 10b is provided between the first nitride region 10a and the metal electrode 11.

The second nitride region 10b is formed of the same nitride as the first nitride region 10a. In the second nitride region 10b, gallium or aluminum is ion-implanted into the first nitride region 10a, which is the difference, but the base nitride is the same. For example, when the first nitride region 10a is aluminum gallium nitride, the base nitride for the second nitride region 10b is also the same aluminum gallium nitride. Alternatively, when the first nitride region 10a is, for example, aluminum nitride, the base nitride for the second nitride region 10b is also the same aluminum nitride.

The second nitride region 10b is metal.

The second nitride region 10b is, for example, aluminum gallium nitride of the metal. The second nitride region 10b is, for example, aluminum gallium nitride which is metallized aluminum gallium nitride of a semiconductor.

The second nitride region 10b is, for example, aluminum nitride of the metal. The second nitride region 10b is, for example, aluminum nitride which is metallized aluminum nitride of a semiconductor.

For example, since the second nitride region 10b is metal, the electrical resistance of the second nitride region 10b increases as the temperature rises. For example, by measuring the temperature dependence of the electrical resistance of the second nitride region 10b, it can be confirmed that the second nitride region 10b is metal.

The sheet resistance of the second nitride region 10b is, for example, 0.1 Ω/sq or less.

The work function of the second nitride region 10b is, for example, 3.7 eV or less. The work function of the second nitride region 10b can be measured using, for example, ultraviolet photoelectron spectroscopy (UPS), X-ray photoelectron spectroscopy (XPS), or Auger electron spectroscopy (AES). In addition, a Kelvin probe can also be used to measure the work function difference between the metal of a sample and the metal of the probe.

The second nitride region 10b contains a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn).

The concentration of the first element contained in the second nitride region 10b is, for example, $1 \times 10^{19}$ cm$^{-3}$ or more and $1 \times 10^{22}$ cm$^{-3}$ or less.

The thickness of the second nitride region 10b is, for example, 0.1 μm or more and 1.0 μm or less.

Of the first element contained in the second nitride region 10b, the sum of the amount of the first element bonded to aluminum (Al) and the amount of the first element bonded to gallium (Ga) is greater than, for example, the amount of the first element bonded to nitrogen (N). In other words, of the first element contained in the second nitride region 10b, the amount of the first element disposed at the nitrogen site of the crystal structure of the nitride forming the second nitride region 10b is greater than the sum of the amount of the first element disposed at the aluminum site of the crystal structure of the nitride and the amount of the first element disposed at the gallium site. In other words, the amount of the first element substituted for nitrogen atoms in the crystal structure of the nitride forming the second nitride region 10b is greater than the sum of the amount of the first element substituted for aluminum atoms in the crystal structure of the nitride and the amount of the first element substituted for gallium atoms.

Of the first element contained in the second nitride region 10b, the sum of the amount of the first element bonded to aluminum (Al) and the amount of the first element bonded to gallium (Ga) is, for example, 10 times or more the amount of the first element bonded to nitrogen (N). Of the first element contained in the second nitride region 10b, the amount of the first element disposed at the nitrogen site of the crystal structure of the nitride forming the second nitride region 10b is 10 times or more the sum of the amount of the first element disposed at the aluminum site of the crystal structure of the nitride and the amount of the first element disposed at the gallium site.

The relation between the sum of the amount of the first element bonded to aluminum (Al) and the amount of the first element bonded to gallium (Ga) and the amount of the first element bonded to nitrogen (N) can be measured using, for example, X-ray photoelectron spectroscopy (XPS).

The metal electrode 11 is provided on the second nitride region 10b. The metal electrode 11 is in contact with the second nitride region 10b.

The metal electrode 11 is metal or a metal compound. The chemical composition of the metal electrode 11 is different from the chemical composition of the second nitride region 10b.

The metal electrode 11 contains, for example, titanium, titanium nitride, aluminum, or tungsten. The metal electrode 11 has, for example, a stacked structure of a titanium film and an aluminum film.

Next, an example of a method for manufacturing the semiconductor device of the first embodiment will be described.

A method for manufacturing the semiconductor device of the first embodiment includes performing a first ion implantation for implanting a first element into an n-type nitride semiconductor, the n-type nitride semiconductor layer being aluminum gallium nitride or aluminum nitride, a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn), performing a second ion implantation of implanting aluminum (Al) or gallium (Ga) into the n-type nitride semiconductor layer, performing a third ion implantation of implanting hydrogen (H) into the n-type nitride semiconductor layer, forming a covering layer on the surface of the n-type nitride semiconductor layer after the performing the first ion implantation, the performing the second ion implantation, and the performing the third ion implantation, performing a first heat treatment after the forming the covering layer, removing the covering layer after the performing the first heat treatment, and performing a second heat treatment after the removing the covering layer.

Hereinafter, a case where the nitride semiconductor layer is an aluminum gallium nitride layer and the first element is magnesium (Mg) will be described as an example. In addition, a case where gallium (Ga) is ion-implanted in the second ion implantation will be described as an example.

FIG. 2 is a diagram illustrating a manufacturing procedure of the method for manufacturing the semiconductor device of the first embodiment. The method for manufacturing the semiconductor device of the first embodiment includes an aluminum gallium nitride layer preparation step S101, a magnesium ion implantation step S102 (first ion implantation), a gallium ion implantation step S103 (second ion implantation), a hydrogen ion implantation step S104 (third ion implantation), a silicon nitride layer formation step S105 (covering layer formation), a first nitrogen annealing step S106 (first heat treatment), a silicon nitride layer removing step S107 (covering layer removing), a second nitrogen annealing step S108 (second heat treatment), and a metal film formation step S109.

Hereinafter, description will be given with reference to FIG. 1.

First, an aluminum gallium nitride layer is prepared (S101). The aluminum gallium nitride layer is, for example, single-crystal aluminum gallium nitride. The aluminum gallium nitride layer corresponds to the nitride layer 10 in FIG. 1. The aluminum gallium nitride layer is an example of the nitride semiconductor layer.

In the aluminum gallium nitride layer, an aluminum gallium nitride region of an n-type semiconductor is formed. The aluminum gallium nitride region corresponds to the first nitride region 10a in FIG. 1.

Next, magnesium (Mg) is ion-implanted into the surface of the aluminum gallium nitride layer using a known ion implantation method (S102). The ion implantation of magnesium corresponds to the first ion implantation.

The region into which magnesium is ion-implanted eventually becomes a second nitride region 10b having the contact structure 100. For example, magnesium may be ion-implanted a plurality of times with different ion implantation energies.

The dose of magnesium is, for example, $1 \times 10^{14}$ cm$^{-2}$ or more and $5 \times 10^{15}$ cm$^{-2}$ or less.

Next, gallium (Ga) is ion-implanted into the surface of the aluminum gallium nitride layer using a known ion implantation method (S103). The ion implantation of gallium corresponds to the second ion implantation.

Gallium is introduced into the region into which magnesium has been ion-implanted. For example, gallium may be ion-implanted a plurality of times with different ion implantation energies.

The dose of gallium is greater than the dose of magnesium, for example. The dose of gallium is, for example, $5 \times 10^{14}$ cm$^{-2}$ or more and $1 \times 10^{16}$ cm$^{-2}$ or less.

The second ion implantation forms a large amount of nitrogen vacancies in the aluminum gallium nitride layer, for example.

In the second ion implantation, aluminum (Al) may be ion-implanted instead of gallium (Ga). Alternatively, in the second ion implantation, gallium (Ga) and aluminum (Al) may be ion-implanted.

Next, hydrogen (H) is ion-implanted into the surface of the aluminum gallium nitride layer using a known ion implantation method (S104). The ion implantation of hydrogen corresponds to the third ion implantation.

Hydrogen is introduced into the region into which magnesium and gallium have been ion-implanted. For example, hydrogen may be ion-implanted a plurality of times with different ion implantation energies.

The dose of hydrogen in the third ion implantation is greater than the dose of magnesium in the first ion implantation, for example. The dose of hydrogen in the third ion implantation is greater than the dose of gallium in the second ion implantation, for example. The dose of hydrogen is, for example, $1 \times 10^{15}$ cm$^{-2}$ or more and $5 \times 10^{16}$ cm$^{-2}$ or less.

Next, a silicon nitride layer is formed on the surface of the aluminum gallium nitride layer using a known film growth method (S105). The silicon nitride layer is an example of the covering layer. The covering layer is not limited to silicon nitride.

The covering layer is, for example, an insulator. The covering layer is, for example, silicon nitride, silicon oxide, silicon oxynitride, or aluminum nitride.

The covering layer is, for example, a conductor or a semiconductor. The covering layer is, for example, polycrystalline silicon.

Next, the first nitrogen annealing is performed (S106). The first nitrogen annealing is performed, for example, in a nitrogen gas atmosphere under a temperature condition of 950° C. or higher and 1250° C. or lower. The first nitrogen annealing is an example of the first heat treatment.

The first heat treatment is performed, for example, in a non-oxidizing atmosphere containing argon, nitrogen, hydrogen, or helium.

The first heat treatment allows magnesium to enter the nitrogen site of the aluminum gallium nitride, for example. The first heat treatment allows magnesium to enter the nitrogen vacancies, for example. Magnesium having entered the nitrogen site of the aluminum gallium nitride is bonded to hydrogen, for example.

Next, the silicon nitride layer on the surface of the aluminum gallium nitride layer is removed using a known wet etching method (S107). The surface of the aluminum gallium nitride layer is exposed.

Next, the second nitrogen annealing is performed (S108). The second nitrogen annealing is performed, for example, in a nitrogen gas atmosphere under a temperature condition of 950° C. or higher and 1250° C. or lower. The second nitrogen annealing is an example of the second heat treatment.

The second heat treatment is performed, for example, in a non-oxidizing atmosphere containing argon, nitrogen, or helium. The second heat treatment is performed, for example, in an atmosphere containing no hydrogen.

The second heat treatment removes hydrogen bonded to magnesium from the magnesium, for example.

Next, a stacked film of a titanium film and an aluminum film is formed on the aluminum gallium nitride layer (S109). The stacked film of the titanium film and the aluminum film is an example of a metal film. The stacked film of the titanium film and the aluminum film eventually becomes a metal electrode 11 of the contact structure 100.

The contact structure 100 of the first embodiment illustrated in FIG. 1 is formed by the above manufacturing method.

Next, functions and effects of the semiconductor device and the method for manufacturing the semiconductor of the first embodiment will be described.

When nitride semiconductors are used to form semiconductor elements, it is desirable to achieve metal electrodes with low connection resistance to nitride semiconductors. Forming metal electrodes with low connection resistance to nitride semiconductors can achieve higher performance of semiconductor elements.

Since the contact structure 100 of the first embodiment includes the second nitride region 10b of metal, it is possible to achieve a highly reliable metal electrode with low connection resistance to the first nitride region 10a of an n-type semiconductor. Details will be described below.

Hereinafter, a case where the nitride layer 10, the first nitride region 10a, and the second nitride region 10b of the contact structure 100 are aluminum gallium nitride and the first element is magnesium (Mg) will be described as an example.

The junction between an aluminum gallium nitride region of an n-type semiconductor and a metal electrode is a junction between a semiconductor and metal. From the viewpoint of work function, there are very limited metal materials that can be used for an ohmic junction with n-type aluminum gallium nitride. Considering the affinity of metal materials for semiconductor processes, it is difficult for the junction between an aluminum gallium nitride region of an n-type semiconductor and a metal electrode to be an ohmic junction. Therefore, there is a high possibility that the junction between an aluminum gallium nitride region of an n-type semiconductor and a metal electrode is a Schottky junction. Consequently, it is difficult to lower the connection resistance between an aluminum gallium nitride region of an n-type semiconductor and a metal electrode.

In addition, the interface between an aluminum gallium nitride region of an n-type semiconductor and a metal electrode is an interface between a semiconductor and metal. For this reason, the strength of the interface may decrease due to the application of temperature or stress. Therefore, the interface may be detached, which lower the reliability of the metal electrode, for example.

FIGS. 3A and 3B are diagrams for explaining functions and effects of the semiconductor device of the first embodiment. FIG. 3A is an energy band diagram of aluminum gallium nitride in which conductive impurities are not actively introduced. FIGS. 3A and 3B illustrate a case where the chemical composition of aluminum gallium nitride is $Al_{0.3}Ga_{0.7}N$. FIG. 3B is an energy band diagram of aluminum gallium nitride of metal corresponding to the second nitride region 10b of the first embodiment.

In undoped gallium nitride, nitrogen vacancies are present. As illustrated in FIG. 3A, the undoped semiconductor aluminum gallium nitride has a nitrogen vacancy energy level below the lower end of the conduction band. The energy (VBE) at the lower end of the conduction band of the aluminum gallium nitride is 3.05 eV. The nitrogen vacancy energy level (VNV) is 3.42 eV.

In the aluminum gallium nitride of the metal, magnesium (Mg) is present at the nitrogen site of the aluminum gallium nitride. As illustrated in FIG. 3B, the work function of the magnesium has energy in the vicinity of the lower end of the conduction band. In other words, the magnesium has energy in the vicinity of the nitrogen vacancy energy level.

Specifically, the nitrogen vacancy energy level (VNV) is 3.42 eV, whereas the work function of the magnesium is 3.66 eV.

According to the first principle calculation by the inventor, it has been found that when a large amount of nitrogen vacancies and magnesium present at the nitrogen site coexist in aluminum gallium nitride, magnesium functions as an electron supply source and supplies electrons to the nitrogen vacancies. Then, as illustrated in FIG. 3B, it has been found that when electrons are supplied from magnesium to the nitrogen vacancies, the nitrogen vacancy energy band expands. Furthermore, it has been found that the Fermi level of aluminum gallium nitride is disposed in the conduction band.

In aluminum gallium nitride of metal, the interaction of a large amount of nitrogen vacancies with magnesium at the nitrogen site brings the Fermi level into the conduction band, and the aluminum gallium nitride, which is originally a semiconductor, is metallized.

Note that, the nitrogen vacancy energy level (VNV) is 3.42 eV, whereas the work function of the magnesium is 3.66 eV which is 0.24 eV greater. In order to supply electrons to the nitrogen vacancies, the work function of the first element serving as an electron supply source is preferably smaller than the nitrogen vacancy energy level (VNV).

However, electrons entering the nitrogen vacancies from the first element facilitates the movement of electrons, and the energy gain corresponding to kinetic energy is obtained by the supply of electrons from the first element. Therefore, even when the work function of the first element is at least about 0.25 eV greater than the nitrogen vacancy energy level (VNV), it is possible to supply electrons from the first element to the nitrogen vacancies. Consequently, even in the case of magnesium whose work function is 0.24 eV greater than the nitrogen vacancy energy level (VNV), it is possible to supply electrons to the nitrogen vacancies.

The contact structure 100 of the first embodiment includes the second nitride region 10b of metal between the first nitride region 10a of the n-type semiconductor and the metal electrode 11. The junction between the second nitride region 10b of the metal and the metal electrode 11 is an intermetallic junction. Therefore, the junction between the second nitride region 10b of the metal and the metal electrode 11 is an ohmic junction, which can lower the connection resistance.

In addition, since the interface between the second nitride region 10b of the metal and the metal electrode 11 is an interface between metal and metal, the decrease in strength due to the application of temperature or stress can be suppressed. Therefore, peel-off of the metal electrode 11 at the interface is suppressed, and the reliability of the metal electrode 11 is improved, for example.

The junction between the first nitride region 10a of the n-type semiconductor and the second nitride region 10b of the metal is a junction between a semiconductor and metal. As described above, the Fermi level of the second nitride region 10b is within the conduction band of the aluminum gallium nitride. In other words, the work function of the second nitride region 10b is smaller than the energy at the lower end of the conduction band of the first nitride region 10a. Therefore, the junction between the first nitride region 10a of the n-type semiconductor and the second nitride region 10b of the metal is an ohmic junction. Consequently, the connection resistance between the first nitride region 10a of the n-type semiconductor and the second nitride region 10b of the metal can be lowered.

The interface between the first nitride region 10a of the n-type semiconductor and the second nitride region 10b of the metal is an interface in which a crystal structure of the aluminum gallium nitride is continuous. Therefore, the strength of the interface is high. Accordingly, even when annealing or the like is performed in a subsequent process, residual oxygen or the like does not enter the continuous interface, and interface peel-off is difficult to occur.

As described above, since the contact structure 100 of the first embodiment includes the second nitride region 10b of metal, the junction between the first nitride region 10a of the n-type semiconductor and the metal electrode 11 is an ohmic junction. Consequently, the highly reliable metal electrode 11 with low connection resistance to the first nitride region 10a of the n-type semiconductor can be achieved. As a secondary effect, the degree of freedom in selection of the metal electrode 11 is greatly improved. For example, a special stacked structure, such as a stacked structure of aluminum and titanium, is not required. For example, titanium nitride (TiN), tungsten (W), polysilicon doped with phosphorus or boron, or the like having excellent workability can be used.

From the viewpoint of reducing the connection resistance of the metal electrode 11, the work function of the second nitride region 10b is preferably 3.7 eV or less.

From the viewpoint of reducing the connection resistance of the metal electrode 11, the sheet resistance of the second nitride region 10b is preferably 0.1 $\Omega$/sq or less.

From the viewpoint of reducing the connection resistance of the metal electrode 11, the magnesium concentration of the second nitride region 10b is preferably $1 \times 10^{19}$ cm$^{-3}$ or more, more preferably $1 \times 10^{20}$ cm$^{-3}$ or more, and still more preferably $1 \times 10^{21}$ cm$^{-3}$ or more.

From the viewpoint of reducing the connection resistance of the metal electrode 11, the sum of the amount of magnesium bonded to aluminum and the amount of magnesium bonded to gallium of the magnesium contained in the second nitride region 10b is preferably greater than the amount of magnesium bonded to nitrogen, and the sum of the amount of magnesium bonded to aluminum and the amount of magnesium bonded to gallium of the magnesium contained in the second nitride region 10b is more preferably 10 times or more the amount of magnesium bonded to nitrogen.

In other words, the amount of magnesium disposed at the nitrogen site of the magnesium contained in the second nitride region 10b is preferably greater than the sum of the amount of magnesium disposed at aluminum site and the amount of magnesium disposed at the gallium site. In addition, the amount of magnesium disposed at the nitrogen site of the magnesium contained in the second nitride region 10b is preferably 10 times or more the sum of the amount of magnesium disposed at aluminum site and the amount of magnesium disposed at the gallium site.

Magnesium disposed at the aluminum site and the gallium site functions as a p-type impurity. Therefore, the presence of magnesium disposed at the aluminum site and the gallium site is undesirable because it interferes with the metallic properties of the second nitride region 10b.

In the manufacturing method of the first embodiment, the second nitride region 10b is formed by ion-implanting magnesium, gallium, and hydrogen into the same region of the aluminum gallium nitride layer. By ion-implanting gallium having a relatively large ionic radius, a large amount of nitrogen vacancies is formed in the aluminum gallium nitride layer. Therefore, a large amount of nitrogen vacancies is present in the second nitride region 10b. Note that even when aluminum is ion-implanted instead of gallium, a large amount of nitrogen vacancies can be formed in the aluminum gallium nitride layer.

Then, magnesium enters the nitrogen vacancies formed in a large amount. In other words, magnesium enters the nitrogen site. As described above, when magnesium enters the aluminum site and the gallium site, magnesium functions as a p-type impurity, which is undesirable.

In the manufacturing method of the first embodiment, by ion implanting gallium, gallium preferentially enters the formed aluminum vacancies or gallium vacancies over magnesium. Therefore, magnesium is inhibited from entering the gallium site. Note that even when aluminum is ion-implanted instead of gallium, magnesium is inhibited from entering the gallium site.

Furthermore, by ion-implanting hydrogen, magnesium is promoted to enter the nitrogen vacancies. Magnesium bonded to hydrogen can exist more stably in nitrogen vacancies than magnesium alone.

On the other hand, magnesium bonded to hydrogen does not serve as an electron supply source to the nitrogen vacancy energy level. Therefore, hydrogen is desorbed from magnesium by the second heat treatment after the covering layer is removed in order for magnesium to function as an electron supply source.

Note that even when the nitride layer 10, the first nitride region 10a, and the second nitride region 10b of the contact structure 100 are aluminum nitride and the first element is other than magnesium (Mg), the junction between the first nitride region 10a of the n-type semiconductor and the metal electrode 11 is an ohmic junction. Consequently, the highly reliable metal electrode 11 with low connection resistance to the first nitride region 10a of the n-type semiconductor can be achieved.

Next, selection of a desirable first element according to the chemical composition of the nitride of the second nitride region 10b will be described.

Figure 4:
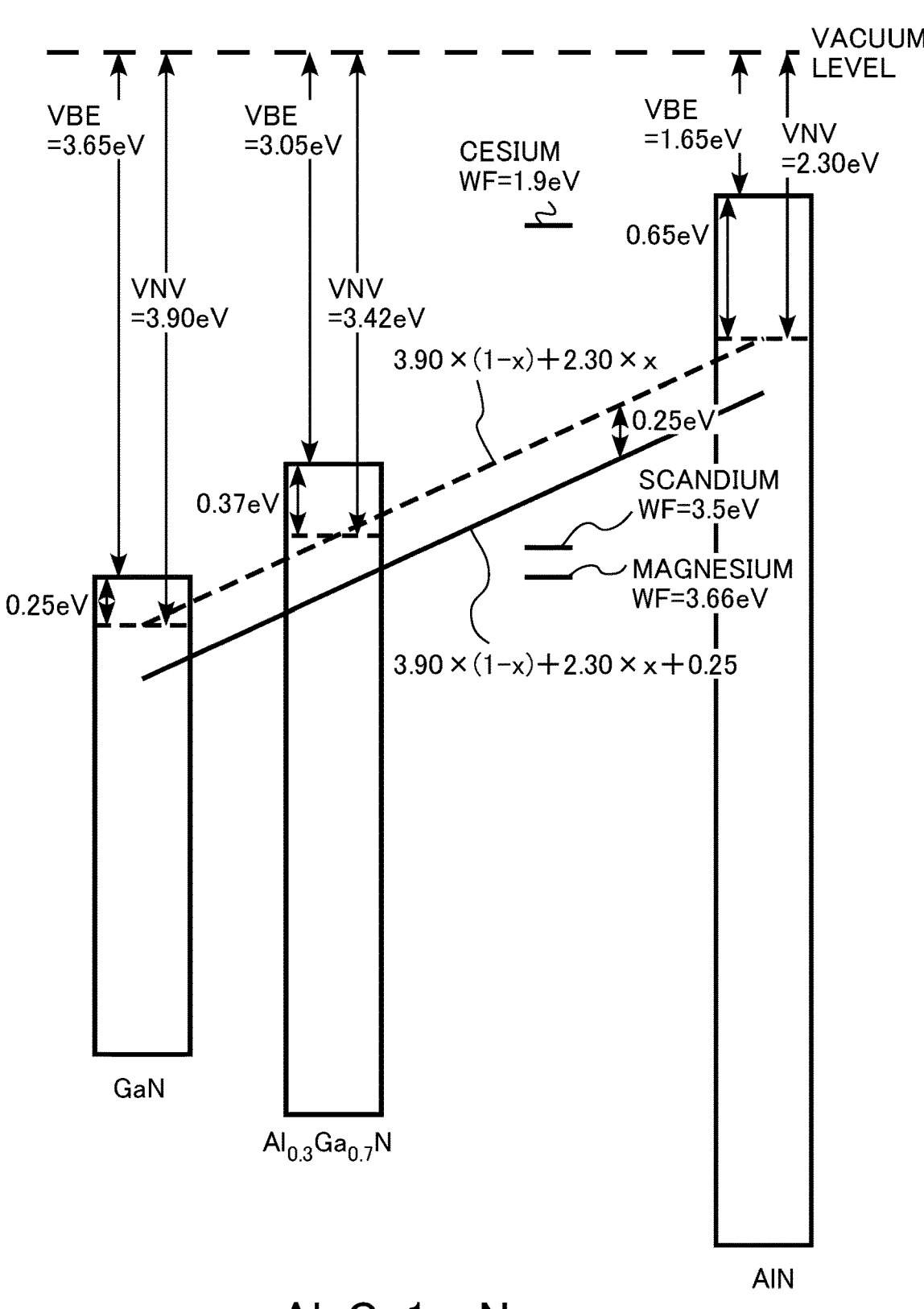
FIG. 4 is a diagram for explaining functions and effects of the semiconductor device of the first embodiment.

FIG. 4 is a diagram for explaining functions and effects of the semiconductor device of the first embodiment.

FIG. 4 is an energy band diagram of a nitride semiconductor whose chemical composition is expressed by the following (Formula A).

$$Al_xGa_{1-x}N \ (0 \le x \le 1) \qquad \text{(Formula A)}$$

In (Formula A), x=0 is gallium nitride (GaN), 0<x<1 is aluminum gallium nitride, and x=1 is aluminum nitride (AlN). FIG. 4 illustrates a case where the aluminum gallium nitride has a chemical composition of x=0.3, that is, $Al_{0.3}Ga_{0.7}N$.

As illustrated in FIG. 4, the energy band changes as the chemical composition of the nitride semiconductor changes. The band gap becomes wider as the composition changes from gallium nitride (GaN) to aluminum nitride (AlN). The energy (VBE) at the lower end of the conduction band decreases as the composition changes from gallium nitride (GaN) to aluminum nitride (AlN).

The nitrogen vacancy energy level (VNV) has an energy greater than the energy (VBE) at the lower end of the conduction band. The difference between the nitrogen vacancy energy level (VNV) and the energy (VBE) at the lower end of the conduction band is 0.25 eV for gallium nitride (GaN) and 0.65 eV for aluminum nitride (AlN).

When the nitrogen vacancy energy level (VNV) is represented by a variable of x, the following (Formula B) is obtained. (Formula B) is represented by a dotted line segment in FIG. 4.

$$VNV=3.90 \times (1-x)+2.30 \times x \qquad \text{(Formula B)}$$

When the chemical composition of the nitride in the second nitride region $10b$ is expressed by the following (Formula 1), the work function WF (eV) of the first element preferably satisfies (Formula 2).

$$Al_xGa_{1-x}N \; (0<x\leq1) \qquad\qquad \text{(Formula 1)}$$

$$3.90\times(1-x)+2.30\times x+0.25\geq WF \qquad\qquad \text{(Formula 2)}.$$

(Formula 2) using (Formula B) can be modified as the following (Formula 2').

$$VNV+0.25\geq WF \qquad\qquad \text{(Formula 2')}$$

As can be seen from (Formula 2'), (Formula 2) indicates that the work function WF of the first element is equal to or less than a value obtained by adding 0.25 eV to the nitrogen vacancy energy level (VNV).

As described above, electrons entering the nitrogen vacancies from the first element facilitates the movement of electrons, and the energy gain corresponding to kinetic energy is obtained by the supply of electrons from the first element. Therefore, even when the work function of the first element is at least about 0.25 eV greater than the nitrogen vacancy energy level (VNV), it is possible to supply electrons from the first element to the nitrogen vacancies. The work function WF (eV) of the first element satisfies (Formula 2), which facilitates the nitride in the second nitride region $10b$ to be metal.

For example, FIG. 4 illustrates work functions of magnesium (Mg), scandium (Sc), and cesium (Cs). The work function of magnesium (Mg) is 3.66 eV, the work function of scandium (Sc) is 3.5 eV, and the work function of cesium (Cs) is 1.9 eV.

In the case of gallium nitride (GaN) and aluminum gallium nitride having a chemical composition of $Al_{0.3}Ga_{0.7}N$, the work functions of magnesium (Mg), scandium (Sc), and cesium (Cs) all satisfy (Formula 2). On the other hand, in the case of aluminum nitride (AlN), only the work function of cesium (Cs) satisfies (Formula 2).

From the viewpoint of further facilitating the nitride of the second nitride region $10b$ to be metal, the work function WF (eV) of the first element more preferably satisfies the following (Formula 3), still more preferably satisfies the following (Formula 4), and most preferably satisfies the following (Formula 5).

$$3.90\times(1-x)+2.30\times x+0.15\geq WF \qquad\qquad \text{(Formula 3)}$$

$$3.90\times(1-x)+2.30\times x+0.05\geq WF \qquad\qquad \text{(Formula 4)}$$

$$3.90\times(1-x)+2.30\times x\geq WF \qquad\qquad \text{(Formula 5)}$$

Hereinafter, work functions of some first elements will be exemplified. For example, the work function of cesium (Cs) is 1.9 eV, potassium (K) is 2.3 eV, niobium (Nb) is 2.3 eV, sodium (Na) is 2.4 eV, strontium (Sr) and barium (Ba) are 2.5 eV, calcium (Ca) is 2.8 eV, lithium (Li) is 2.9 eV, yttrium (Y) is 3.1 eV, scandium (Sc) is 3.5 eV, zinc (Zn) is 3.6 eV, and magnesium (Mg) is 3.66 eV.

As described above, according to the semiconductor device and the method for manufacturing the semiconductor device of the first embodiment, it is possible to provide a semiconductor device capable of achieving a metal electrode with low connection resistance to a nitride semiconductor.

Second Embodiment

A semiconductor device of a second embodiment is a horizontal high electron mobility transistor (HEMT) including the contact structure of the first embodiment. Hereinafter, the description overlapping with the first embodiment will be partially omitted.

Figure 5:
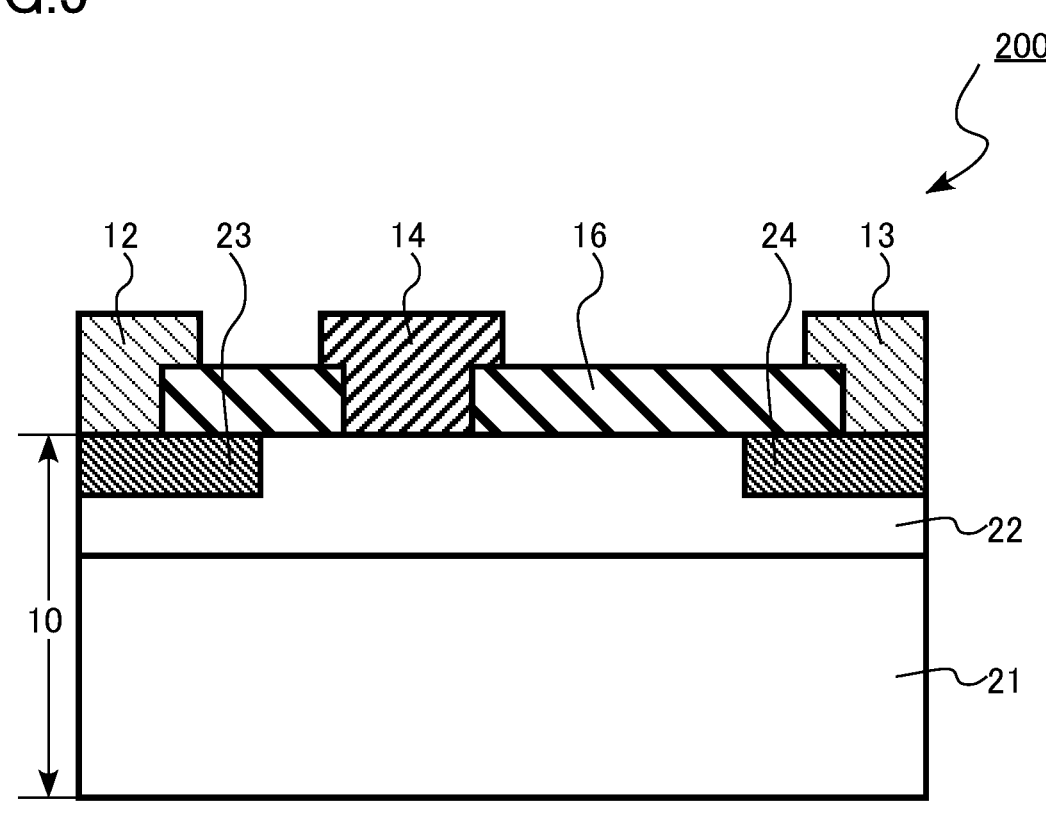
FIG. 5 is a schematic sectional view illustrating a semiconductor device of a second embodiment.

FIG. 5 is a schematic sectional view illustrating the semiconductor device of the second embodiment. The semiconductor device of the second embodiment is a horizontal HEMT 200.

The horizontal HEMT 200 of the second embodiment includes a nitride layer 10, a source electrode 12 (metal electrode), a drain electrode 13 (metal electrode), a gate electrode 14, and an interlayer insulating layer 16. The nitride layer 10 includes a gallium nitride region 21, an aluminum gallium nitride region 22 (first nitride region), a first metal region 23 (second nitride region), and a second metal region 24 (second nitride region).

In the horizontal HEMT 200, a two dimensional electron gas (2DEG) is formed at an interface between the gallium nitride region 21 and the aluminum gallium nitride region 22. By forming the two dimensional electron gas, an on-current flows between the source electrode 12 and the drain electrode 13. By changing the gate voltage applied to the gate electrode 14, the on and the off operation of the horizontal HEMT 200 is controlled.

The interlayer insulating layer 16 is formed on the nitride layer 10. The interlayer insulating layer 16 is, for example, silicon oxide.

The gallium nitride region 21 is a semiconductor. The gallium nitride region 21 is in contact with the aluminum gallium nitride region 22. The aluminum gallium nitride region 22 is provided between the gallium nitride region 21 and the first metal region 23. The aluminum gallium nitride region 22 is provided between the gallium nitride region 21 and the second metal region 24.

The aluminum gallium nitride region 22 is an example of the first nitride region. The aluminum gallium nitride region 22 is an n-type semiconductor.

The first metal region 23 is an example of the second gallium nitride region.

The first metal region 23 is provided on the aluminum gallium nitride region 22. The first metal region 23 is in contact with the source electrode 12. The first metal region 23 is provided between the aluminum gallium nitride region 22 and the source electrode 12.

The first metal region 23 is metal. The first metal region 23 is aluminum gallium nitride of the metal. The first metal region 23 is aluminum gallium nitride which is metallized aluminum gallium nitride of a semiconductor.

The first metal region 23 contains a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn).

The source electrode 12 is an example of the metal electrode. The source electrode 12 is provided on the first metal region 23. The source electrode 12 is in contact with the first metal region 23.

The second metal region 24 is an example of the second nitride region.

The second metal region 24 is provided on the aluminum gallium nitride region 22. The second metal region 24 is in contact with the drain electrode 13. The second metal region 24 is provided between the aluminum gallium nitride region 22 and the drain electrode 13.

The second metal region 24 is metal. The second metal region 24 is aluminum gallium nitride of the metal. The second metal region 24 is aluminum gallium nitride which is metallized aluminum gallium nitride of a semiconductor.

The second metal region 24 contains a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn).

The drain electrode 13 is an example of the metal electrode. The drain electrode 13 is provided on the second metal region 24. The drain electrode 13 is in contact with the second metal region 24.

In the horizontal HEMT 200 of the second embodiment, a contact structure similar to the contact structure 100 of the first embodiment is applied to the contact structure between the source electrode 12 and the nitride layer 10. Therefore, the connection resistance between the source electrode 12 and the nitride layer 10 is reduced. Furthermore, the reliability of the source electrode 12 is improved.

In addition, in the horizontal HEMT 200 of the second embodiment, a contact structure similar to the contact structure 100 of the first embodiment is applied to the contact structure between the drain electrode 13 and the nitride layer 10. Therefore, the connection resistance between the drain electrode 13 and the nitride layer 10 is reduced. Furthermore, the reliability of the drain electrode 13 is improved.

Therefore, for example, the highly reliable horizontal HEMT 200 with low on-resistance can be achieved.

Furthermore, the horizontal HEMT 200 of the second embodiment includes the second metal region 24 on the drain electrode 13 side. For example, the electric field due to the electric charges injected into the interlayer insulating layer 16 and trapped in the interlayer insulating layer 16 during the on operation of the horizontal HEMT 200 is shielded by the second metal region 24. In addition, for example, the charges injected into the interlayer insulating layer 16 during the on operation of the horizontal HEMT 200 pass through the second metal region 24 to the drain electrode 13. Therefore, the current collapse of the horizontal HEMT 200 is suppressed, and the reliability of the horizontal HEMT 200 is improved.

(Modification)

A semiconductor device of a modification of the second embodiment is different from the semiconductor device of the second embodiment in that a second nitride region is in contact with a gallium nitride region.

Figure 6:
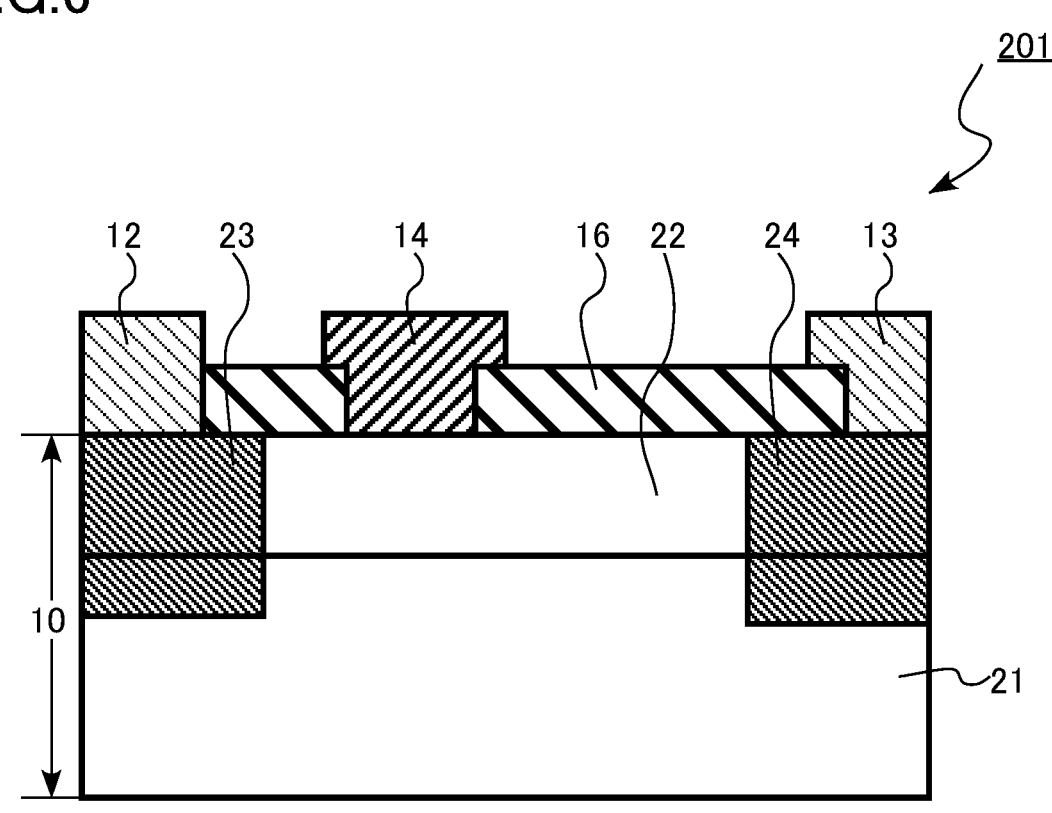
FIG. 6 is a schematic sectional view illustrating a semiconductor device of a modification of the second embodiment.

FIG. 6 is a schematic sectional view illustrating the semiconductor device of the modification of the second embodiment. The semiconductor device of the modification of the second embodiment is a horizontal HEMT 201.

In the horizontal HEMT 201 of the second embodiment, a first metal region 23 (second nitride region) is in contact with a gallium nitride region 21. In addition, a second metal region 24 (second nitride region) is in contact with the gallium nitride region 21.

As described above, according to the semiconductor device of the second embodiment and the modification, it is possible to provide a semiconductor device capable of achieving a metal electrode with low connection resistance to a nitride semiconductor.

In the second embodiment, the horizontal HEMT has been described as an example of the semiconductor device, but the present disclosure can also be applied to other semiconductor devices. For example, the present disclosure can also be applied to an optical semiconductor device, such as a vertical HEMT, a diode, or a light emitting diode (LED), or an electron gun.

While certain embodiments have been described, these embodiments have been presented by way of example only, and are not intended to limit the scope of the inventions. Indeed, a semiconductor device and a method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first nitride region being nitride selected from aluminum gallium nitride and aluminum nitride, the first nitride region being an n-type semiconductor; and
a second nitride region in contact with the first nitride region, the second nitride region being the nitride, the second nitride region having metallic conductivity to behave like a metal, the second nitride region containing a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn),
wherein the second nitride region has a sum of an amount of the first element bonded to aluminum (Al) and an amount of the first element bonded to gallium (Ga) greater than an amount of the first element bonded to nitrogen (N).

2. The semiconductor device according to claim 1, wherein a chemical composition of the nitride in the second nitride region is expressed by (Formula 1), and a work function WF (eV) of the first element satisfies (Formula 2);

$$Al_xGa_{1-x}N \ (0<x\leq1) \tag{Formula 1}$$

$$3.90\times(1-x)+2.30\times x+0.25\geq WF \tag{Formula 2}.$$

3. The semiconductor device according to claim 1, further comprising a metal electrode in contact with the second nitride region.

4. The semiconductor device according to claim 1, wherein sheet resistance of the second nitride region is 0.1 $\Omega$/sq or less.

5. The semiconductor device according to claim 1, wherein a concentration of the first element in the second nitride region is $1\times10^{19}$ cm$^{-3}$ or more.

6. The semiconductor device according to claim 1, further comprising a gallium nitride region in contact with the first nitride region, wherein the first nitride region is provided between the gallium nitride region and the second nitride region.

7. The semiconductor device according to claim 1, further comprising a gallium nitride region in contact with the first nitride region, wherein the second nitride region is in contact with the gallium nitride region.

8. A semiconductor device comprising:
a first nitride region being nitride selected from aluminum gallium nitride and aluminum nitride, the first nitride region being an n-type semiconductor; and
a second nitride region in contact with the first nitride region, the second nitride region being the nitride, the second nitride region containing a first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn), the second nitride region having a sum of an amount of the first element bonded to aluminum (Al) and an amount of the first element bonded to gallium (Ga) greater than an amount of the first element bonded to nitrogen (N).

9. The semiconductor device according to claim 8, wherein a chemical composition of the nitride in the second nitride region is expressed by (Formula 1), and a work function WF (eV) of the first element satisfies (Formula 2);

$$Al_xGa_{1-x}N \ (0<x\leq1) \qquad \text{(Formula 1)}$$

$$3.90\times(1-x)+2.30\times x+0.25\geq WF \qquad \text{(Formula 2)}.$$

10. The semiconductor device according to claim 8, further comprising a metal electrode in contact with the second nitride region.

11. The semiconductor device according to claim 8, wherein sheet resistance of the second nitride region is 0.1 $\Omega$/sq or less.

12. The semiconductor device according to claim 8, wherein a concentration of the first element in the second nitride region is $1\times10^{19}$ cm$^{-3}$ or more.

13. The semiconductor device according to claim 8, further comprising a gallium nitride region in contact with the first nitride region, wherein the first nitride region is provided between the gallium nitride region and the second nitride region.

14. The semiconductor device according to claim 8, further comprising a gallium nitride region in contact with the first nitride region, wherein the second nitride region is in contact with the gallium nitride region.

15. A method for manufacturing a semiconductor device comprising:
performing a first ion implantation for implanting first element into an n-type nitride semiconductor layer, the n-type nitride semiconductor layer being aluminum gallium nitride or aluminum nitride, the first element being at least one element selected from a group consisting of beryllium (Be), magnesium (Mg), calcium (Ca), strontium (Sr), barium (Ba), scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), vanadium (V), niobium (Nb), tantalum (Ta), lithium (Li), sodium (Na), potassium (K), rubidium (Rb), cesium (Cs), and zinc (Zn);
performing a second ion implantation for implanting aluminum (Al) or gallium (Ga) into the n-type nitride semiconductor layer;
performing a third ion implantation of implanting hydrogen (H) into the n-type nitride semiconductor layer;
forming a covering layer on a surface of the n-type nitride semiconductor layer after the performing the first ion implantation, the performing the second ion implantation, and the performing the third ion implantation;
performing a first heat treatment after the forming the covering layer;
removing the covering layer after the performing the first heat treatment; and
performing a second heat treatment after the removing the covering layer,
wherein a dose of hydrogen in the third ion implantation is greater than a sum of a dose of aluminum (Al) and a dose of gallium (Ga) in the second ion implantation, and the sum of the dose of aluminum (Al) and the dose of gallium (Ga) in the second ion implantation is greater than a dose of the first element in the first ion implantation.

16. The method for manufacturing the semiconductor device according to claim 15, further comprising forming a metal film on the n-type nitride semiconductor layer after the performing the second heat treatment.

\* \* \* \* \*